United States Patent [19]
Jung

[11] Patent Number: 6,049,203
[45] Date of Patent: Apr. 11, 2000

[54] APPARATUS AND METHOD FOR TESTING AN INKER OF THE SEMICONDUCTOR WAFER PROBE STATION

[75] Inventor: Seok-Hwan Jung, Bucheon, Rep. of Korea

[73] Assignee: Samsung Electronics Co., Ltd., Kyungki-do, Rep. of Korea

[21] Appl. No.: 09/124,341

[22] Filed: Jul. 29, 1998

[30] Foreign Application Priority Data

Jul. 29, 1997 [KR] Rep. of Korea ....................... 97-35815

[51] Int. Cl.[7] .................................................. G01R 31/02
[52] U.S. Cl. .................... 324/158.1; 324/759; 346/140.1
[58] Field of Search ............................... 324/158.1, 72.5, 324/759, 765, 754; 346/140.1, 33 F

[56] References Cited

U.S. PATENT DOCUMENTS

| | | | |
|---|---|---|---|
| 4,390,885 | 6/1983 | Shah et al. | 346/140.1 |
| 4,568,879 | 2/1986 | Nakamura et al. | 324/759 |
| 4,992,729 | 2/1991 | Nadeau | 324/765 |

*Primary Examiner*—Josie Ballato
*Assistant Examiner*—Minh Tang
*Attorney, Agent, or Firm*—F. Chau & Associates, LLP

[57] ABSTRACT

An inker test apparatus is provided for use with a wafer probe station. The test apparatus includes a plurality of movable parts which allow positioning of the inker adjacent the wafer area. Sensors are provided adjacent the inker solenoid and the inkline of the inker. A control panel has keys for selecting parameters of the solenoid operation number and time and for displaying the tests results. Also, a controller responds to the input parameters from the control panel to produce a corresponding solenoid drive signal. The controller also detects malfunction of the solenoid and inkline based on the output signals from the solenoid sensor and inkline sensor. Further, a power supply is provided for generating suitable operating voltage for the inker solenoid.

14 Claims, 6 Drawing Sheets

APPARATUS AND METHOD FOR TESTING AN INKER OF THE SEMICONDUCTOR WAFER PROBE STATION

BACKGROUND

1. Field of the Invention

The present invention relates to semiconductor device manufacturing equipment, and more particularly to an apparatus and method for testing an inker used in a semiconductor wafer probe station.

2. Backgound of the Invention

At the end of a semiconductor fabrication process, there is normally performed a series of wafer test processes in order to sort good and failed chips of the wafer through testing of electrical characteristics in each chip. Such a wafer test process is also called "Electrical Die Sorting (EDS)" in DRAM fabrication area. Upon completion of the die testing, failed chips are marked with an ink to identify them with the naked eye in a subsequent assembly process. This inking process is performed by an inker provided in the wafer probe station.

A conventional inker device is shown in FIG. 1. The inker 10 includes an ink reservoir 14 and ink tube 15 through which an inkline 18 is inserted. The upper end of inkline 18 is coupled to a shaft 13 which is in turn coupled to the plunger of a solenoid 12. The ink reservoir 14 and solenoid 12 are mounted to an arm 22 so that the inkline 18 and shaft 13 are aligned with the solenoid plunger and moved up and down a short distance by actuation of the solenoid 12. The inker mounting arm 22 is extended to a support member 86 via an extension bar and coupled by a hinge pin 25. Provided at upper portion of the extension bar are a thumb screw 24 for XY preload adjustment, an XY positioning lever 26, a Z-adjust thumb screw 27, and a nylon ball 28 for preloading an amount of weight onto the hinged inker mounting arm 22. Also, reference numeral 16 denotes a screw for holding inkline fine adjustment knob. The wafer 42 is mounted onto a vacuum chuck 40 and located beneath the inker 10.

Details of the inker reservoir 14 and inkline 18 are shown in FIG. 2, in which inkline 18 is extended outside the ink tube 15 and the inker 10 has been adjusted to locate the extended inkline 18' above the wafer 42, approximately 2 mils away from the wafer surface. The ink 16 contained in the reservoir 14 migrates to the tip of the inkline 18' through the gap between the ink tube 15 and inkline 18. Although the inkline 18' is out of contact with the wafer surface 42, ink transfer can be made by the principle of "surface tension."

The inkline 18 is also moved between the retraction and protrusion position by the movement of the shaft 13 coupled to the plunger of the solenoid 12. The distance of the inkline retraction, denoted by D1, is about 30 mils. Also, the distance of the inkline protrusion, denoted by D2, is about 30 mils. The distance of the inkline travel Dt will be about 60 mils. Reference numeral Dw denotes the distance of inkline to the wafer surface when inkline is extended.

It is essential that the inkline 18 is moved to the desired protrusion position and the distance of the inkline protrusion is maintained during the inking process. Thus, it is necessary to test the inker device before starting the inking process. The inker test has been performed such that an inker test button provided in the probe station is pressed to produce test signals which are supplied to an inker solenoid and then the solenoid movement is observed by the operator. Secondly, the inker test is carried out at the side part of a wafer to identify operation of the inkline by observing the ink mark on the wafer.

The prior art inker test method, however, is troublesome and time-consuming since each test step is performed manually by an operator. Further, the number of inker test operations and the test speed may vary depending on each operator, with the result that errors occur during every test and the test operations are not reliable. Furthermore, since observations are made by the naked eye, only malfunctions capable of detection by the naked eye can be detected. Another problem experienced in known probe stations is that the number of inker test operations and the operating time cannot be set up to depend on the kind of inker being used. This results in a difficulty in testing all kinds of inkers accurately and thus, lowers the quality of inker testing.

SUMMARY OF THE INVENTION

The present invention is intended to solve the prior art problems, and it is therefore an object of the invention to provide an inker test apparatus which can set testing condition for an inker and automatically detect malfunctions of the inker without manually checking the inker.

In accordance with the present invention, an apparatus for testing an inker used in a wafer probe station comprises: a base; a first movable part provided onto the base for moving the inker horizontally along the top surface of the base; a second movable part mounted on the first movable part with one end thereof being coupled to an inker mounting arm for moving the inker vertically relative to the base; a third movable part mounted on the first movable part with one end thereof being provided with a first sensor for detecting operation of the inker solenoid and moving vertically relative to the base at a designated distance; a fourth movable part provided on the base which moves horizontally along the top surface of the base at a designated distance for positioning a second sensor for detecting movement of the inkline; a wafer loading part placed between the first and fourth movable parts for mounting a wafer thereon and moving the wafer beneath the inkline of the inker; a control panel having keys for selecting parameters of the solenoid operation including number and time, and for displaying the test result; a controller which acts in response to the input parameters to produce the corresponding solenoid drive signal and functions to detect malfunctions of the solenoid and inkline based on the output signals from the first and second sensors; and a power supply for generating suitable operating voltage for the solenoid and for supplying power to the inker solenoid.

In accordance with the present invention, a method for testing an inker is incorporated in a wafer probe station. The inker includes an inkline inserted into the ink reservoir and ink tube, and a solenoid which moves the inkline up and down a short distance by actuation of the solenoid. The method comprises the steps of installing the inker on an inker mounting arm so that the ink tube is in the center of an inker array; positioning a solenoid sensor and an inkline sensor such that the solenoid sensor senses the movement of the solenoid plunger and the inkline sensor senses the movement of the inkline of the inker; inputting the inker operating parameters through a control panel; setting an operating voltage for the inker solenoid through a control panel of the power supply; generating a control signal based on the operation parameters input when the inker test start button of the control panel is pressed to produce an inker drive pulse having a desired number of drive pulses and a desired pulse duration; determining whether the solenoid sensor output signal is input in synchronization with the drive pulse; counting the solenoid error if abnormal operation of the solenoid is detected; determining whether the inkline sensor output signal is input in synchronization with the drive pulse; counting the inkline error if abnormal operation of the inkline is detected; determining whether a stop key of the control panel is input; and displaying the number of solenoid error count and inkline error count on a display of the control panel if the test stop key is pressed.

Preferably, the inker operating parameters include the number of the inker actuations, the inker actuation time, and the inker inactivation time. Also, the number of drive pulse corresponds to the number of the inker actuations set by the operator, the high level pulse duration of the drive pulse corresponds to the inker actuation time, and the low level pulse duration corresponds to the inker inactivation time.

BRIEF DESCRIPTION OF THE DRAWINGS

This invention may be understood and its object and advantages will become apparent to those skilled in the art by reference to the accompanying drawings as follows.

DETAILED DESCRIPTION OF PREFERRED EMBODIMENTS

Figure 1:
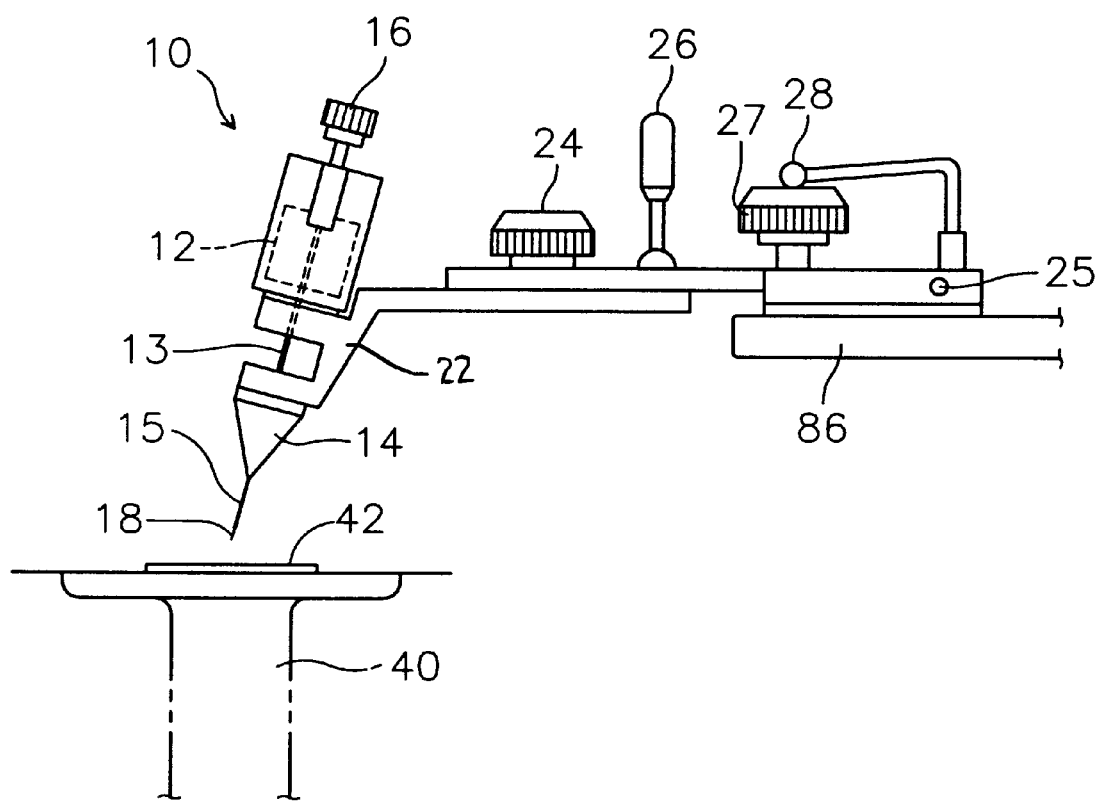
FIG. 1 is a front view of a prior art inker device used in a wafer probe station.
Figure 2:
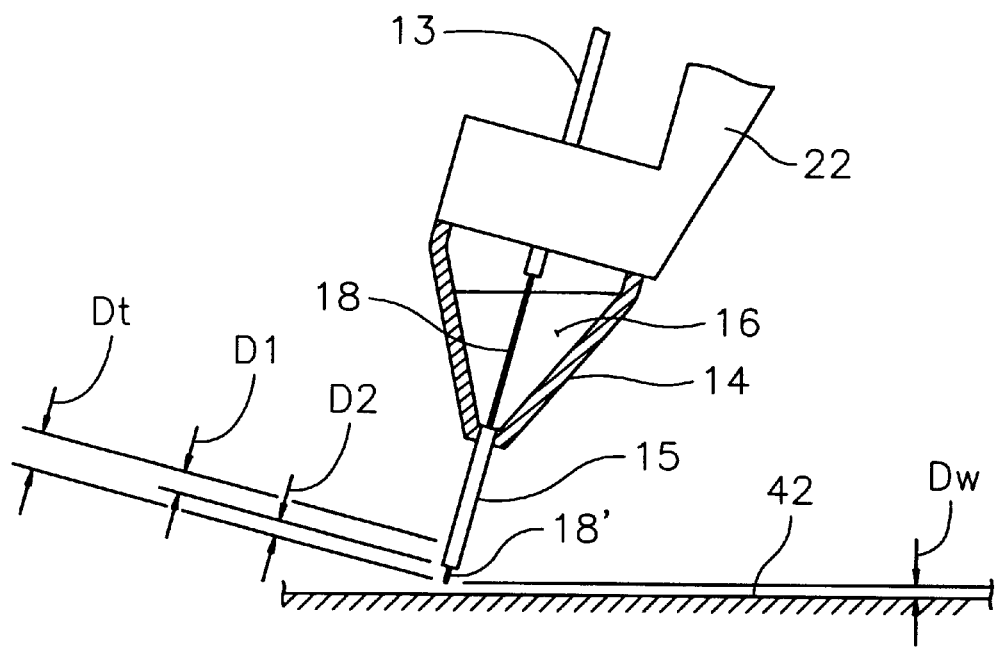
FIG. 2 is a partial sectional view of the inker reservoir and the inkline shown in FIG. 1.
Figure 3:
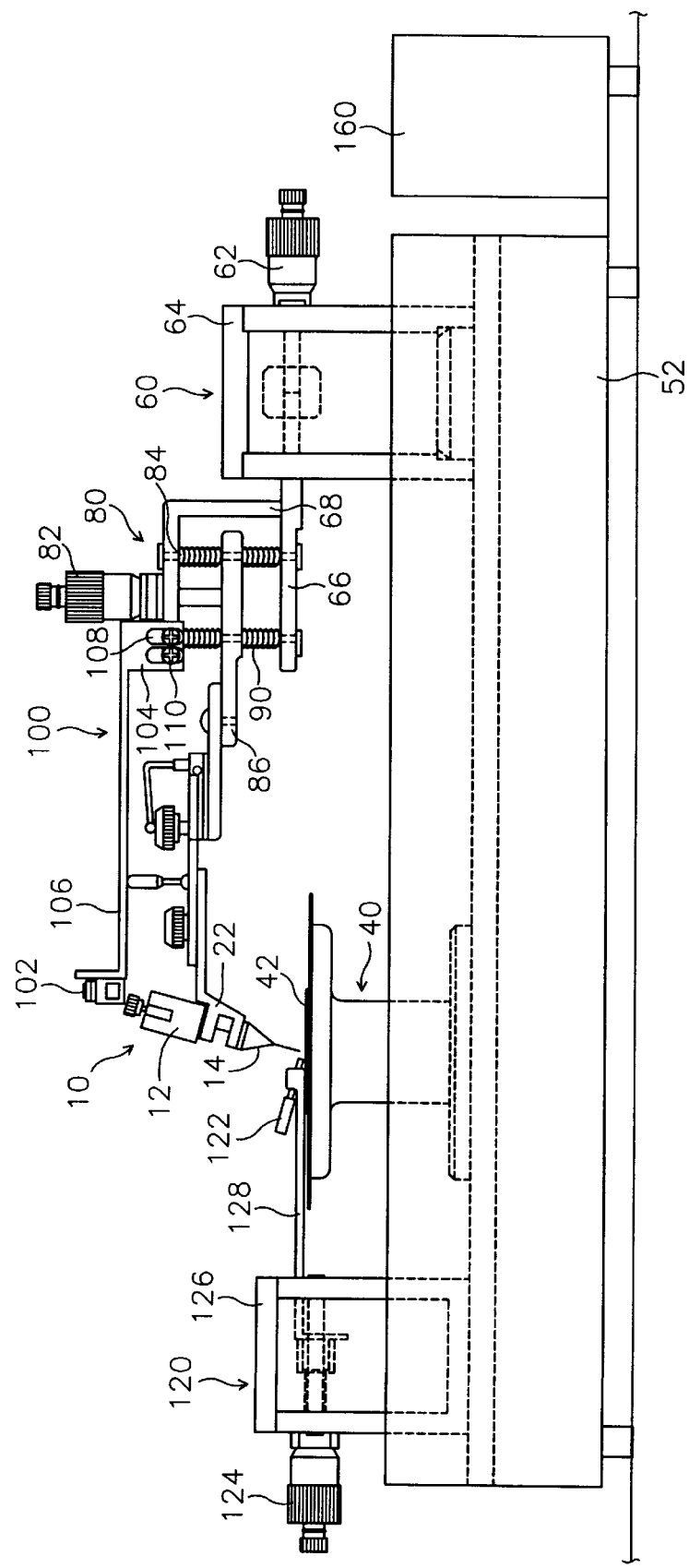
FIG. 3 is a front elevation of an inker test apparatus incorporated into a wafer probe station in accordance with the present invention.

Referring to FIG. 3, there is shown an inker test apparatus incorporated into a wafer probe station in accordance with the present invention. The wafer probe station generally includes a base 52 constituting a frame thereof. Also, an inker 10 and a vacuum chuck 40 are movably installed on the base 52. The inker 10 and the vacuum chuck 40 are the same as or similar to those shown in FIGS. 1 and 2. Provided onto the base 52 are a first movable part 60 moving horizontally along the top surface of the base 52 for positioning the inker 10, and a fourth movable part 120 facing the first movable part 60 and moves horizontally along the top surface of the base 52 for positioning a sensor 122 detecting protrusion/retraction of inkline of the inker 10.

The first movable part 60 is provided with a second movable part 80 with its one end being coupled to an inker mounting arm 22 for moving the inker 10 vertically relative to the base 52 and a third movable part 100 with one end thereof being provided with a sensor 102 for detecting operation of an inker solenoid 12.

More particularly, the first movable part 60 includes a fixture 64 coupled to the base 52 and having a predetermined height, a micrometer 62 mounted at one side of the fixture 64 and having an axle extended into the fixture, a first guider 66 coupled to the axle of the micrometer 62 through the fixture 64, and a second guider 68 mounted to the first guider 66 and extended upwardly and bent along the first guider 66.

Further, the second movable part 80 includes at least one guiding rod 84 placed between the first guider 66 and the second guider 68 with both ends thereof being coupled to the first and second guiders 66 and 68, a supporting member 86 slidably mounted to the guiding rod 84 and located between the first guider 66 and the second guider 68, and a micrometer 82 mounted to the second guider 68 and to the supporting member 86 through the second guider 68 for moving the supporting member 86. Coil spring 90 is wound around the guide rod 84 and it is placed between the first guider 66 and the supporting member 86, as well as between the second guider 68 and supporting member 86.

Also, the third movable part 100 includes a height adjustment part 104 for adjusting height thereof related to the supporting member 86, and an extension rod 106 extended from the height adjustment part 104 horizontally above the inker 10 for mounting the inker solenoid sensor 102. The height adjustment part 104 has at least one screw 110 which is fixed to the second guider 68 through a rectangle slot 108 formed in the height adjustment part 104.

Further, the fourth movable part 120 includes a fixture 126 coupled to the base 52 and having a predetermined height, a micrometer 124 mounted at one side of the fixture 120 and having an axle extended into the fixture, and an extension rod 128 coupled to the axle of the micrometer 124 through the fixture 126 for mounting the inkline sensor 122 at the end part thereof.

The vacuum chuck 40 is preferably placed between the first and fourth movable parts and a wafer 42 is mounted thereon by a vacuum force. The vacuum chuck 40 is raised up with a wafer 42 to the proper location beneath the inker 12 where the inking process can be carried out. Also, a power supply 160 is provided in the probe station to generate suitable operating voltage for the solenoid 12.

Figure 4:
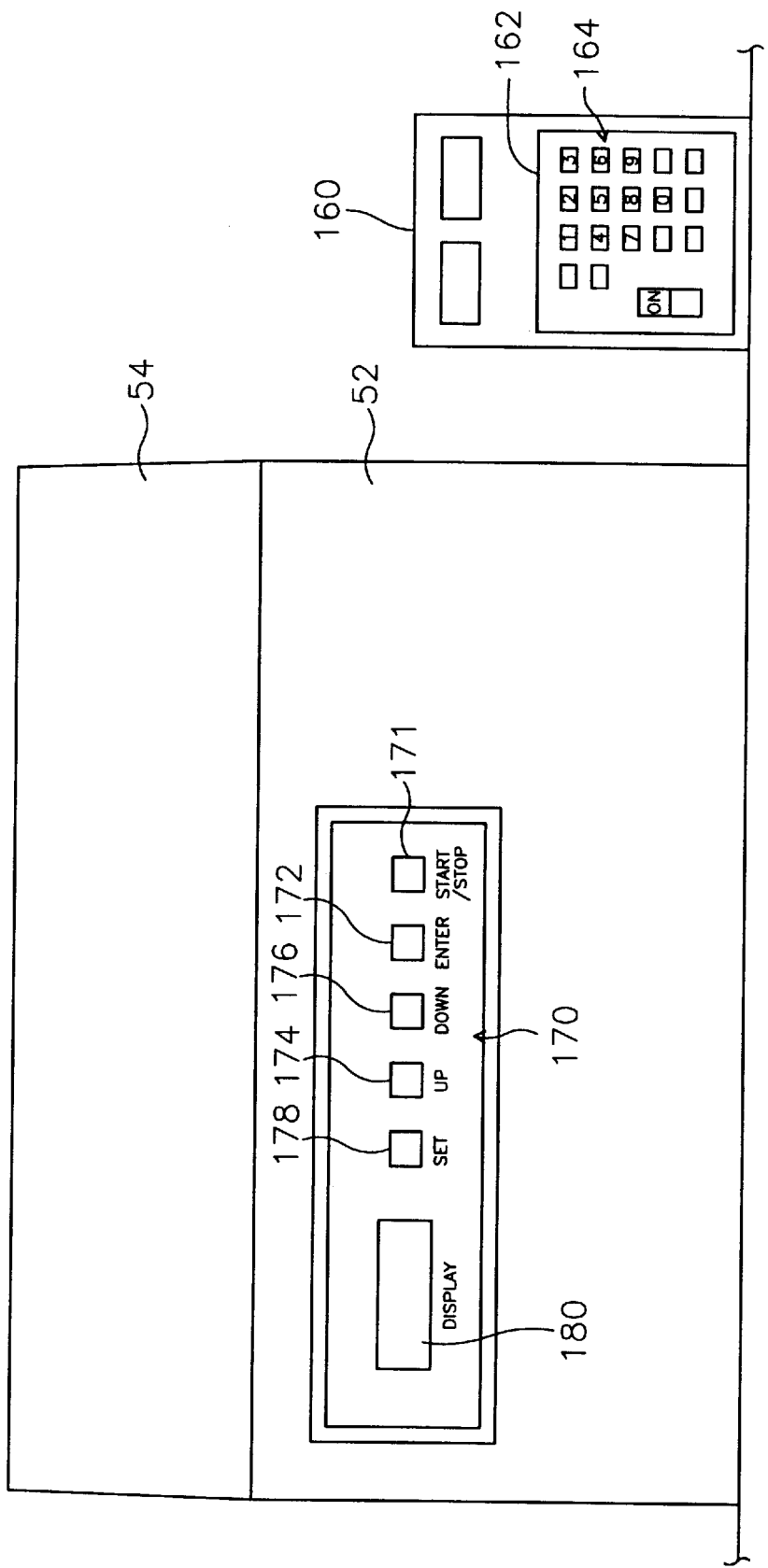
FIG. 4 is an exterior view of the inker test apparatus of FIG. 3, showing control panels of the inker test apparatus and power supply.

FIG. 4 shows the exterior of the inker test apparatus in accordance with the invention. The inker test apparatus has a control panel 170 provided at front side of the base 52. A cover 54 may be provided at the top portion of the base 52. Also, the power supply 160 has a control panel 162. The control panel 170 of the inker test apparatus includes up and down keys 174 and 176, an input setting key 178, a menu entry key 172, and a test start/stop key 171. Also, the control panel 170 includes a display 180 for displaying a control menu, an operating parameter input value, and results of the inker test. The control panel 162 of the power supply 160 has a key pad 162 including a power on/off key and ten keys for inputting suitable operating voltages for the inker 10.

Figure 5:
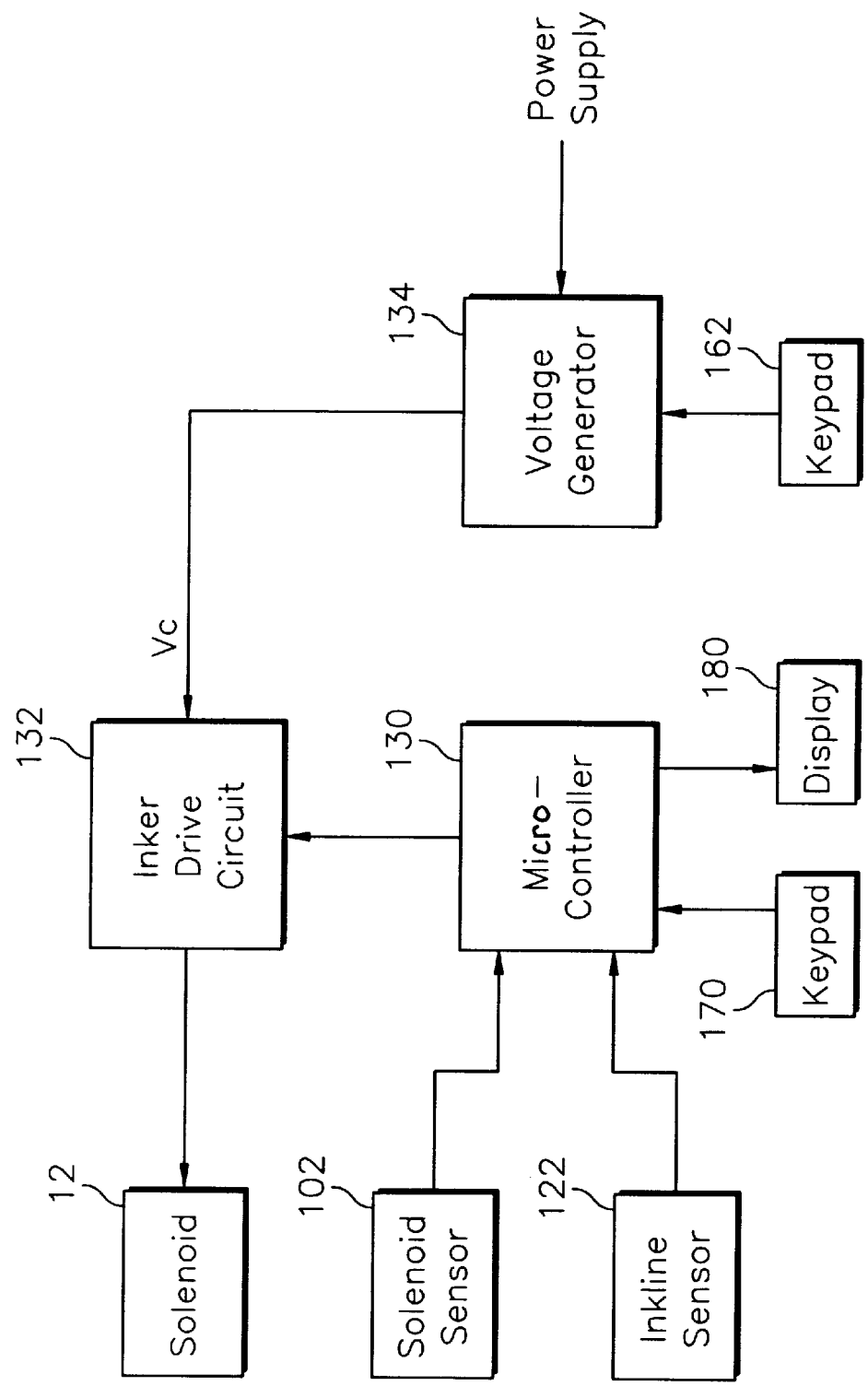
FIG. 5 is a block diagram of the inker test apparatus of FIG. 3, showing an electrical configuration of the inker test apparatus.

Referring to FIG. 5, there is shown an electrical configuration of the inker test apparatus in accordance with the present invention. The inker test apparatus includes a microcontroller 130 having a micro-program for controlling test operations of the inker 10 in response to an input value from the control panel 170. Output terminals of the solenoid sensor 102 and inkline sensor 122 are connected to input terminals of the microcontroller 130. The solenoid sensor preferably includes a photo sensor and senses movement of the inker solenoid 12. Also, the inkline sensor 122 includes a photo sensor and senses the inkline retraction/protrusion movement.

The display 180 of the control panel 170, preferably a LCD panel, is connected to output terminals of the microcontroller 130. Also, an inker drive circuit 132 is connected with an output terminal of the microcontroller 130. The output of the inker drive circuit 132 is connected with the solenoid 12. The inker drive circuit 132 generates a driving pulse which is supplied to the solenoid 12 in response to a control signal fed from the microcontroller 130. The control signal determines the number of the driving pulses generated in the inker drive circuit 132, which will define the number of solenoid actuations. Also, the width of the driving pulse is determined by the control signal to define the duration of each solenoid actuation.

An operating voltage supply line is connected at input of the inker drive circuit 132. The operating voltage Vc is generated by a voltage generator 134. The voltage generator 134 receives DC output from the power supply 160 and generates the operating voltage Vc required for the solenoid 12 according to the key input from key pad 162.

Figure 6:
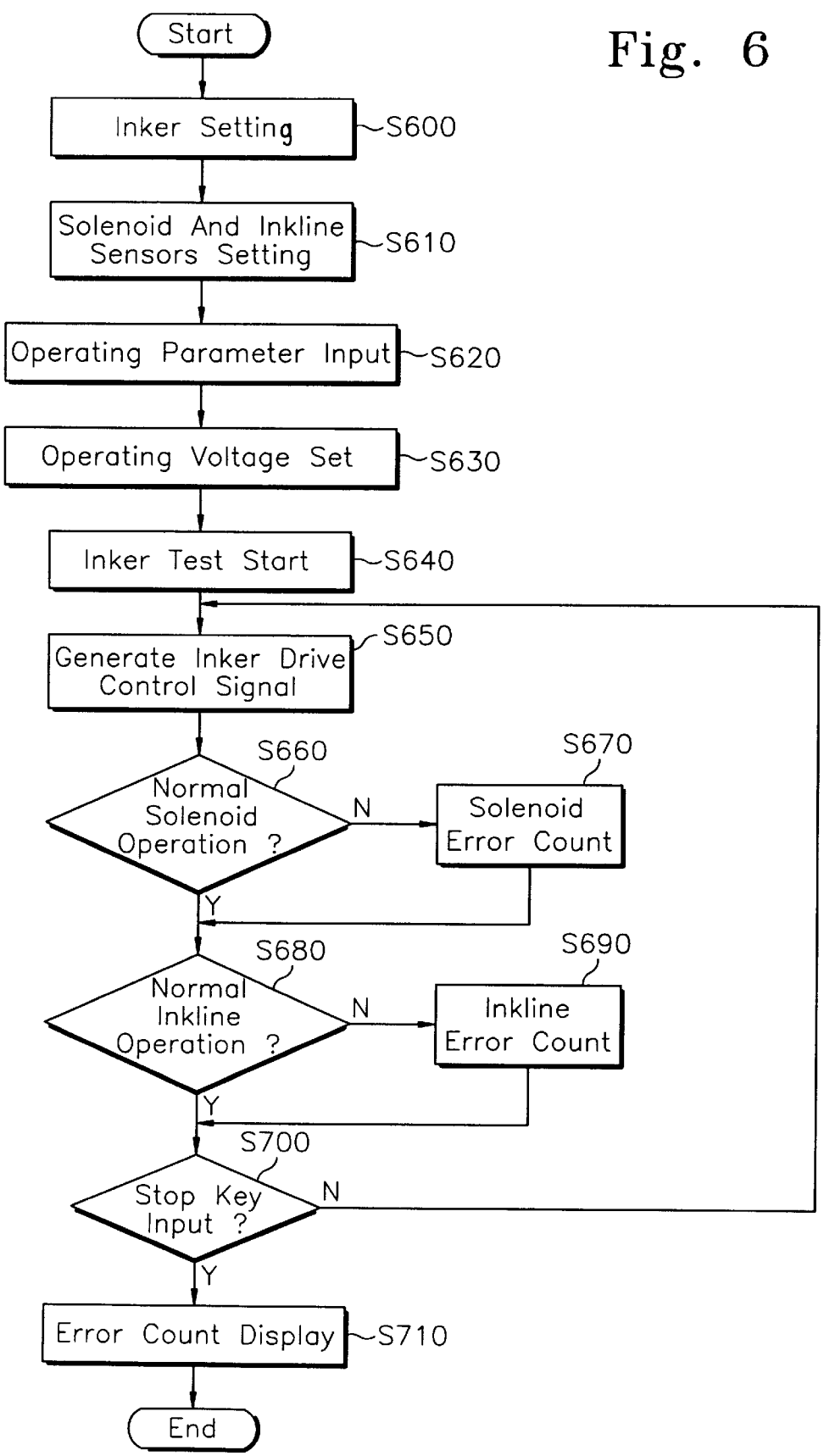
FIG. 6 is a flow diagram depicting inker test operation performed in the inker test apparatus of FIG. 3 in accordance with the present invention.

FIG. 6 illustrates the inker test operation performed in the inker test apparatus in accordance with the present invention. First, at step 600, the inker 10 is installed on the inker mounting arm 22 so that the ink tube is in the center of the inker array. After that, the chuck 40 is raised with a wafer 42 up to the inker array, and the inker 10 is positioned relative to the wafer 42 by adjusting the position of the first and second movable parts 60 and 80. Next, the inkline is extended and the inker 10 is adjusted vertically until the extended inkline is approximately 2 mils away from the wafer surface.

Next, at step 610, the solenoid sensor 102 and the inkline sensor 122 are positioned such that the sensor 102 senses the movement of the solenoid plunger by adjusting the position of the third movable part 100 and the sensor 122 senses the movement of the inkline of inker 10 by adjusting the position of the fourth movable part 120.

The inker operating parameter is inputted at step 620 by using the keys 171–178 on the control panel 170. For example, the enter key 172 allows the display 180 of the control panel to display a main menu. Then up/down keys 174, 176 allows selection of the parameters. The parameters may include the number of inker actuations, the inker actuation time, and the inker inactivation time. After setting the inker operating conditions, an operating voltage required for the inker solenoid 12 is determined at step 630 by using the ten-key 164 of the control panel 162 on the power supply 160.

When the inker test start button 171 of the control panel 170 is pressed at step 640, the microcontroller 130 generates a control signal in response to the inker operation parameters inputted at step 620. The control signal is supplied to the inker drive circuit 132 to produce inker drive pulses having the voltage level preset by the voltage generator 134. The number of the drive pulses corresponds to the number of inker actuations set by the operator. Also, the high level pulse duration of the drive pulse corresponds to the inker actuation time, and the low level pulse duration corresponds to the inker inactivation time.

The inker solenoid 12 is actuated when the inker drive pulse is applied from the inker drive circuit 132. As the solenoid plunger is moved, the photo sensor 102 recognizes the movement of the solenoid sensor and produces an output pulse signal. In synchronization with producing a drive signal pulse, the microcontroller 130 determines whether the solenoid sensor output signal is inputted at step 660. If abnormal operation of the solenoid is detected, the solenoid error is counted by the microcontroller 130 at step 670. If normal operation of the solenoid is found, it proceeds to step 680 to determine whether the inkline of the inker is normally operated. The movement of the inkline 18' (FIG. 2) is sensed by the inkline sensor 122 whenever the inkline 18' is moved to the protrusion position. As the inkline is moved to the protrusion position, the inkline photo sensor 122 recognizes its movement and produces a corresponding output pulse signal. In synchronization with producing an inker drive pulse, the microcontroller 130 determines whether the inkline sensor output signal is inputted. If abnormal operation of the inkline 12 is detected, the inkline error is counted at the microcontroller 130 at step 690.

If normal inkline operation is found at step 680, it proceeds to step 700 to determine whether the stop key 171 is inputted. If the test stop key is pressed, the number of solenoid error count and inkline error count are displayed in the LCD display 180. With this, the number of abnormal operation of the solenoid as well as the inkline can be found automatically through the display 180. As a result, good and poor quality solenoid and inkline operation of an inker can be discriminated in an easy way, and repair or replacement of the inker can be carried out at once. Further, the inker testing time can be considerably reduced, and the subsequent inking process for the failed chip can be performed reliably.

What is claimed is:

1. An apparatus for testing an inker used in a wafer probe station, in which the inker includes an inkline inserted into an ink reservoir and ink tube, and a solenoid which moves the inkline up and down within the ink tube by the actuation of the solenoid, the apparatus comprising:

a base;

a first movable part provided on the base for moving the inker horizontally along the top surface of the base;

a second movable part supported on the first movable part with one end thereof being coupled to an inker mounting arm, the second movable part being operable to move the inker vertically relative to the base;

a third movable part supported by the first movable part, the third movable part being provided with a first sensor for detecting operation of the inker solenoid, the third movable part being movable vertically relative to the base;

a fourth movable part supported on the base, the fourth movable part being provided with a second sensor and being movable horizontally along the top surface of the base to position the second sensor to detect movement of the inkline;

a wafer loading part placed between the first and fourth movable parts for mounting a wafer thereon and moving the wafer beneath the inkline of the inker;

a control panel having keys for selecting parameters of the solenoid operation and a display for displaying test results;

a controller operatively connected to the control panel, the controller producing a solenoid drive signal and detecting malfunction of the solenoid and inkline based on output signals from the first and second sensors; and a power supply for generating suitable operating voltage for the solenoid.

2. The apparatus of claim 1, wherein the first movable part includes a fixture coupled to the base and having a predetermined height, a micrometer mounted at one side of the fixture and having an axle extended into the fixture, a first guider coupled to the axle of the micrometer through the fixture, and a second guider mounted to the first guider and extended upwardly and bent along the first guider.

3. The apparatus of claim 1, wherein the second movable part includes at least one guiding rod placed between the first guider and the second guider with both ends thereof being coupled to the first and second guiders, a supporting member slidably mounted about the guiding rod and located between the first guider and the second guider, and a second micrometer mounted to the second guider and to the supporting member through the second guider for moving the supporting member.

4. The apparatus of claim 3, wherein the second movable part further includes a coil spring wound around the guide rod and placed between the first guider and the supporting member and a second coil spring wound around the guide rod and placed between the second guider and supporting member.

5. The apparatus of claim 1, wherein the third movable part includes a height adjustment part for adjusting height thereof relative to the supporting member, and an extension rod extending from the height adjustment part horizontally above the inker for mounting the first sensor, and wherein the height adjustment part has at least one screw secured to the second guider through a slot formed in the height adjustment part.

6. The apparatus of claim 1, wherein the fourth movable part includes a fixture coupled to the base and having a predetermined height, a micrometer mounted at one side of the fixture and having an axle extending into the fixture, and an extension rod coupled to the axle of the micrometer through the fixture for mounting the second sensor at the end part thereof.

7. The apparatus of claim 1, wherein the power supply includes a control panel for selecting the operating voltage for the solenoid.

8. The apparatus of claim 7, wherein the control panel of the power supply has a key pad including a power on/off key and ten keys for inputting suitable operating voltages for the inker.

9. The apparatus of claim 1, wherein the controller includes:
   a microcontroller having a memory for storing a microprogram for controlling test operations of the inker in response to an input value from the control panel, input terminals connected with outputs of the solenoid sensor and inkline sensor, an output terminal for connecting with the display of the control panel;
   an inker drive circuit for generating a driving pulse to be supplied to the solenoid in response to a control signal from the microcontroller;
   a voltage generator for generating an operating voltage required for the solenoid based on the key input from the control panel.

10. The apparatus of claim 9, wherein the control signal output from the microcontroller determines the number of the driving pulses generated in the inker drive circuit which defines the number of the solenoid actuations, and the width of the driving pulse is determined by the control signal to define duration of the solenoid actuation.

11. The apparatus of claim 1, wherein the control panel of the inker test apparatus includes an up/down keys, an input setting key, a menu entry key, a start/stop key, and a display for displaying a control menu, an operating parameter input value and results of the inker test.

12. A method for testing an inker incorporated in a wafer probe station, in which the inker includes an inkline inserted into the ink reservoir and ink tube, and a solenoid having a solenoid plunger which moves the inkline up and down within the ink tube by the actuation of the solenoid, the method comprising:
   installing the inker on an inker mounting arm so that the ink tube is in the center of an inker array;
   positioning a solenoid sensor and an inkline sensor such that the solenoid sensor senses the movement of the solenoid plunger and the inkline sensor senses the movement of the inkline of inker;
   inputting inker operating parameters through a control panel;
   setting an operating voltage for the inker solenoid through the control panel;
   generating a control signal based on the input operation parameters in response to pressing a test start button on the control panel to produce an inker drive pulse having desired number of drive pulses and a desired pulse duration;
   determining whether the solenoid sensor output signal is inputted in synchronization with the drive pulse;
   counting the solenoid error if abnormal operation of the solenoid is detected;
   determining whether the inkline sensor output signal is inputted in synchronization with the drive pulse;
   counting the inkline error if abnormal operation of the inkline is detected;
   determining whether a stop key of the control panel is inputted; and
   displaying the number of solenoid error count and inkline error count on a display of the control panel if the test stop key is pressed.

13. The method of claim 12, wherein the inker operating parameters include the number of the inker actuations, the inker actuation time, and the inker inactivation time.

14. The method of claim 12, wherein the number of the drive pulses corresponds to the number of the inker actuations set by the operator, the high level pulse duration of the drive pulse corresponds to the inker actuation time, and the low level pulse duration corresponds to the inker inactivation time.

* * * * *